United States Patent
Kelcourse et al.

(10) Patent No.: US 7,515,882 B2
(45) Date of Patent: Apr. 7, 2009

(54) APPARATUS, METHODS AND ARTICLES OF MANUFACTURE FOR A MULTI-BAND SWITCH

(76) Inventors: Mark F. Kelcourse, 511 Princeton Blvd., Lowell, MA (US) 01853; Christopher N. Brindle, 48 Homefield Ave., Dracut, MA (US) 01826

( * ) Notice: Subject to any disclaimer, the term of this patent is extended or adjusted under 35 U.S.C. 154(b) by 1374 days.

(21) Appl. No.: 10/737,375

(22) Filed: Dec. 16, 2003

(65) Prior Publication Data

US 2004/0141470 A1 Jul. 22, 2004

Related U.S. Application Data

(63) Continuation-in-part of application No. 10/660,355, filed on Sep. 11, 2003.

(60) Provisional application No. 60/434,380, filed on Dec. 17, 2002.

(51) Int. Cl.
*H04B 1/44* (2006.01)

(52) U.S. Cl. .......................... 455/78; 455/82; 455/101; 455/121; 333/103; 333/101; 330/51; 330/151; 330/86

(58) Field of Classification Search .................. 455/78, 455/82, 101, 121; 333/103, 101; 330/51, 330/151, 86
See application file for complete search history.

(56) References Cited

U.S. PATENT DOCUMENTS

| | | | | |
|---|---|---|---|---|
| 4,531,235 A | * | 7/1985 | Brusen | 455/273 |
| 5,282,186 A | * | 1/1994 | Yoshio et al. | 369/47.21 |
| 6,066,993 A | * | 5/2000 | Yamamoto et al. | 333/103 |
| 6,127,886 A | | 10/2000 | Khabbaz et al. | |
| 6,282,186 B1 | | 8/2001 | Wood, Jr. | |
| 6,292,047 B1 | | 9/2001 | Traylor | |
| 6,324,211 B1 | * | 11/2001 | Ovard et al. | 375/219 |
| 6,351,183 B1 | | 2/2002 | Khabbaz et al. | |
| 6,366,622 B1 | * | 4/2002 | Brown et al. | 375/322 |
| 6,396,137 B1 | * | 5/2002 | Klughart | 257/691 |
| 6,483,391 B1 | * | 11/2002 | Magoon et al. | 331/183 |
| 6,492,192 B1 | * | 12/2002 | O'Toole et al. | 438/57 |
| 6,492,897 B1 | * | 12/2002 | Mowery, Jr. | 455/522 |
| 6,518,855 B1 | * | 2/2003 | Gerlach et al. | 333/103 |
| 6,671,496 B1 | * | 12/2003 | Hoshi | 455/78 |
| 7,269,392 B2 | * | 9/2007 | Nakajima et al. | 455/83 |
| 2001/0040479 A1 | | 11/2001 | Zhang | |
| 2003/0207668 A1 | * | 11/2003 | McFarland et al. | 455/3.01 |
| 2004/0141470 A1 | * | 7/2004 | Kelcourse et al. | 370/282 |
| 2006/0118884 A1 | * | 6/2006 | Losehand et al. | 257/376 |

FOREIGN PATENT DOCUMENTS

| | | |
|---|---|---|
| DE | 198 32 565 A1 | 8/1999 |
| WO | WO 99/46859 | 9/1999 |

* cited by examiner

*Primary Examiner*—Matthew D Anderson
*Assistant Examiner*—April S Guzman

(57) ABSTRACT

The invention is directed to a multi-band switch having a transmitter switching section with a plurality of transmission ports, and a receiver switching section with a plurality of receiver ports, each having associated switching topologies to switch one of the ports to an antenna port. The switching topologies may use a plurality of series-connected FETs, such as insulated gate n-channel FETs, where the transmitter port switching elements may have larger switching transistors than the receiver port switching elements. The main signal path transistors of the transmitter and receiver switching elements be interdigitated FETs, in which source region fingers and drain region fingers alternate within the transistor area. These interdigitated source and drain regions may be spaced apart from each other by a sinuous channel region, over which is a gate metallization.

17 Claims, 10 Drawing Sheets

APPARATUS, METHODS AND ARTICLES OF MANUFACTURE FOR A MULTI-BAND SWITCH

CROSS REFERENCE TO RELATED APPLICATIONS

This application is a Continuation-in-Part of U.S. patent application Ser. No. 10/660,355 filed Sep. 11, 2003 which claims benefit from U.S. Ser. No. 60/434,380 filed Dec. 17, 2002, the contents of which are fully incorporated by reference herein.

BACKGROUND

The field of the invention is switches, and more particularly multi-band switches for wireless transmission and reception as fabricated on a single semiconductor chip.

Conventional switch devices operate to control the path on which a signal travels. In general, there are two basic types of switch devices in use: electromechanical and solid state. Solid state switches use some kind of semiconductor device for the switching process, which can be diodes, field effect transistors or bipolar transistors. In general, diode switches have a lower insertion loss, while switches comprised of transistors are faster. Field effect transistors (FETs) have been employed in the switching of high frequency signals, such as radio frequencies (RF).

A FET switch is in an OFF status (high impedance) until a control voltage of a predetermined magnitude (saturation voltage) is applied to its gate. When the saturation voltage is applied to the gate, the FET switches to an ON status in which its current path between its source and drain exhibits very low resistance.

While a theoretical FET switch would provide no output until the saturation voltage is applied to the gate, at which point a predefined output would be provided to the drain, in practice FETs leak current prior to the application of the saturation voltage. Further, after the control gate voltage is reached and the switch is in operation, harmonics appear in the output voltage. Circuit designers seek to sharpen the point at which FETs turn on and seek to minimize output voltage harmonics. At the same time, integrated circuit designers seek to minimize on-chip real estate wherever possible, while at the same time pursuing lower control voltages. Designers of signal switches also attempt to minimize the impedance insertion loss in the signal path.

In conventional wireless switching practice (e.g. wireless LAN, Bluetooth, CDMA, TDMA, GSM, W-CDMA and the like) there has developed a need to both transmit data outward on an antenna and to receive data inward on an antenna in wireless fashion. Heretofore these tasks have been performed using different transmitter and receiver chips. It would be technically advantageous to combine these functions on a single-die integrated circuit which, however, does not unduly suffer from having its receiver ports being unduly loaded with capacitance due to the coexistence of on-chip transmitter switching circuits, and vice versa.

SUMMARY OF THE INVENTION

The invention discloses apparatus, methods and articles of manufacture for a multi-band switch. Embodiments of the invention include a single-die integrated circuit, on which there is implemented a transmitter switching section having a plurality of transmission ports, and a receiver switching section having a plurality of receiver ports. The transmitter and receiver ports each have associated switching topologies, which are operable to switch a selected one of the ports to an antenna port, for transmission of an outbound signal or reception of an inbound signal.

At least one of the switching topologies is arranged in stages, with a first stage being proximate the antenna port and a last stage being proximate each of a plurality of the transmitter or receiver ports. One transistor, or transistor switching element consisting of several series transistors, is energized in order to pass a signal from a selected port through the last stage, and the switching element comprising the first stages in order to connect the selected port to the antenna port. The remaining portions of the last stage as well as the remaining switching topologies are deactivated so as to isolate those ports from the antenna port. In a preferred embodiment, these cascaded stages are used in switching a selected one of the receiver ports to the antenna port.

According to a preferred embodiment of the invention, the switching topologies are implemented using field effect transistors, and more preferably insulated gate n-channel field effect transistors, although other semiconductor devices can be used for the same purpose. Since the strength of the outbound transmitter signals will be substantially greater than signals received by the antenna connected to the antenna port, the transmitter port switching elements have larger switching transistors than the receiver port switching elements. In the illustrated embodiment, each transmitter port switching element includes a plurality of series-connected FETs so as to lower the saturation voltage which needs to be applied to the gates in order to put them in an "ON" state. Further, it is preferred that the main signal path transistors of the transmitter and receiver switching elements be interdigitated FETs, in which source region fingers and drain region fingers alternate within the transistor area. These interdigitated source and drain regions are spaced apart from each other by a sinuous channel region, over which is a gate metallization.

According to one preferred aspect of the invention, bypass resistors are placed across each of the signal-passing switching element transistors in order to sharpen the voltages at which these switching transistors turn on and off. The transistor switching topologies preferably further include feedforward capacitors for power handling and to dampen unwanted harmonics. Shunt transistors may be used to connect the gates of those switching transistors in an OFF state to ground, so as to improve the isolation of unselected ports from the antenna port.

Principal technical advantages of various embodiments of the invention include the provision of a single-die integrated circuit for both the transmission and reception of wireless signals while minimizing switching element insertion loss, and the reduction of capacitive loading on the switched ports of such a chip.

BRIEF DESCRIPTION OF THE DRAWINGS

Further aspects of the invention will be discerned with reference to the following detailed description when taken in conjunction with the drawings, in which like characters are denoted by like parts and in which.

DETAILED DESCRIPTION

Figure 1:
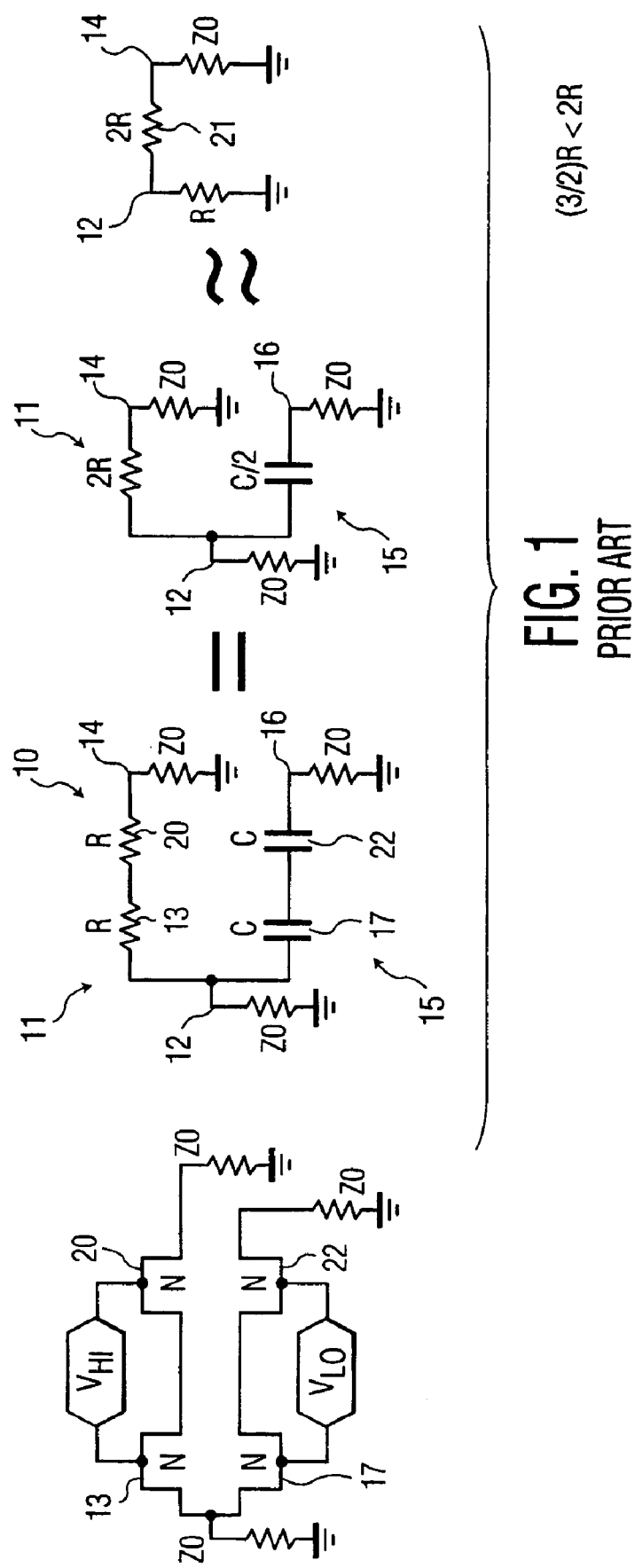
FIG. 1 is a set of schematic electrical circuit diagrams modeling the impedance of a conventional switch having two branches, two series switches per branch, with one branch in an "ON" state, according to the prior art.
Figure 2:
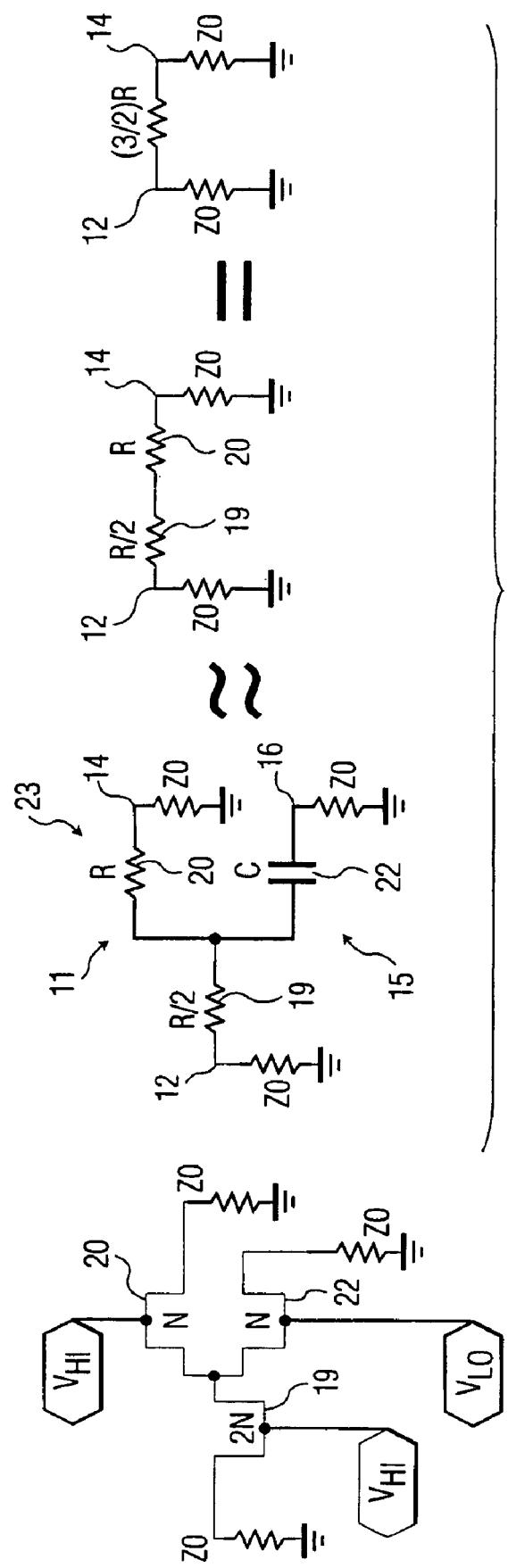
FIG. 2 is a set of schematic electrical circuit diagrams modeling the impedance of a cascaded switch according to an embodiment of the invention, with the electrical switches of one selected branch being in an "ON" state.

FIGS. 1 and 2 are sets of electrical schematic diagrams which model the impedance of a theoretical two-branch switching path according to conventional practice (FIG. 1), and according to a cascaded method used in accordance with embodiments of the invention (FIG. 2). In FIGS. 1 and 2, one branch 11 of the illustrated switch is in an ON state, permitting a signal to pass from an input 12 to an output 14. The other branch 15 leads to an output 16. Both topologies are constructed of insulated gate field effect transistors (IGFETs). In FIG. 1, a two-branch switch indicated generally at 10 has a first branch 11, which includes two FET switches 13 and 20, here modeled as resistances with a value R. The other branch 15 has two FETs 17 and 22, which in their OFF state have dominating junction capacitances C. As shown in the first simplification, branch 11 has an equivalent resistance 2R while branch 15 has an equivalent junction capacitance C/2. Simplifying by one more step, this may be approximated by an overall insertion loss 21 of 2R.

FIG. 2 shows a switching schema having the same objective in which a signal propagates through the same number of switches or transistors as appear in the circuit in FIG. 1. But cascaded switch 23 has a large capacity FET 19 with a gate perimeter that is twice that of e.g. FET 20, therefore contributing an ON resistance of R/2. This FET 19 takes the place of branch FETs 13 and 17 in FIG. 1. ON FET 20 exhibits a resistance R, while OFF FET 22 shows a junction capacitance C. The first simplification of this circuit neglects the capacitance of FET 22, leaving R/2 and R in series. As is shown in the last simplification, this reduces to an equivalent insertion loss of 3/2 R, which is less than the 2R insertion loss exhibited by the circuit of FIG. 1.

Figure 3:
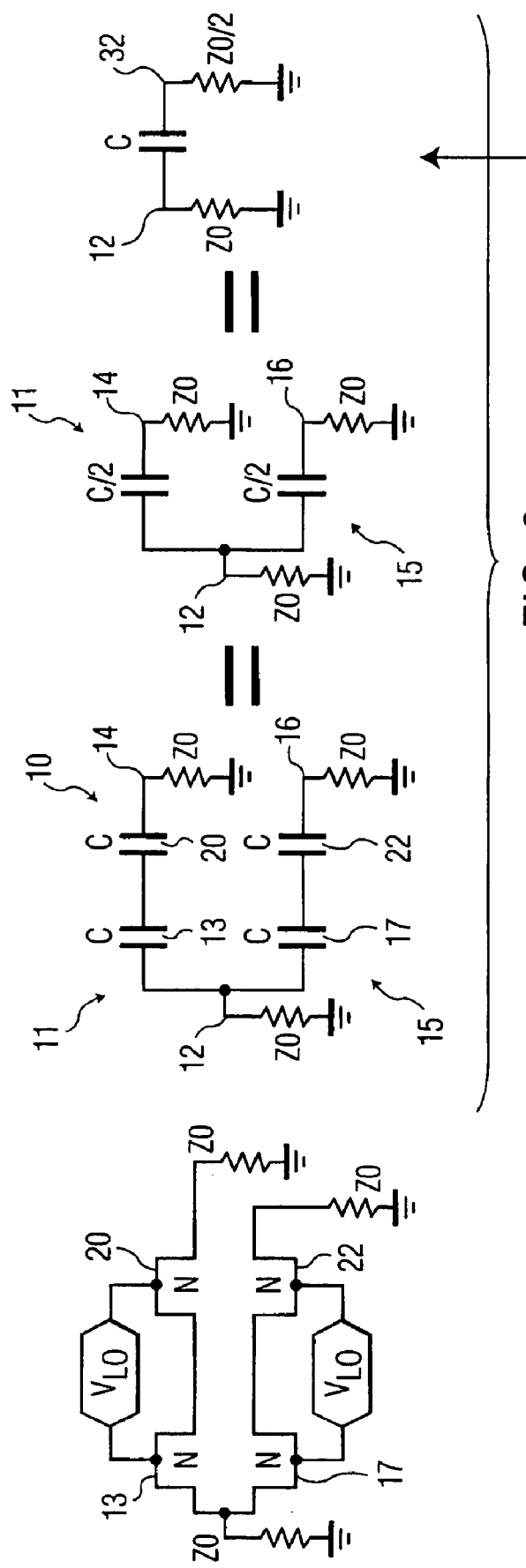
FIG. 3 is a set of schematic electrical circuit diagrams modeling the impedance of the circuit illustrated in FIG. 1, with both branches being in an "OFF" state.
Figure 4:
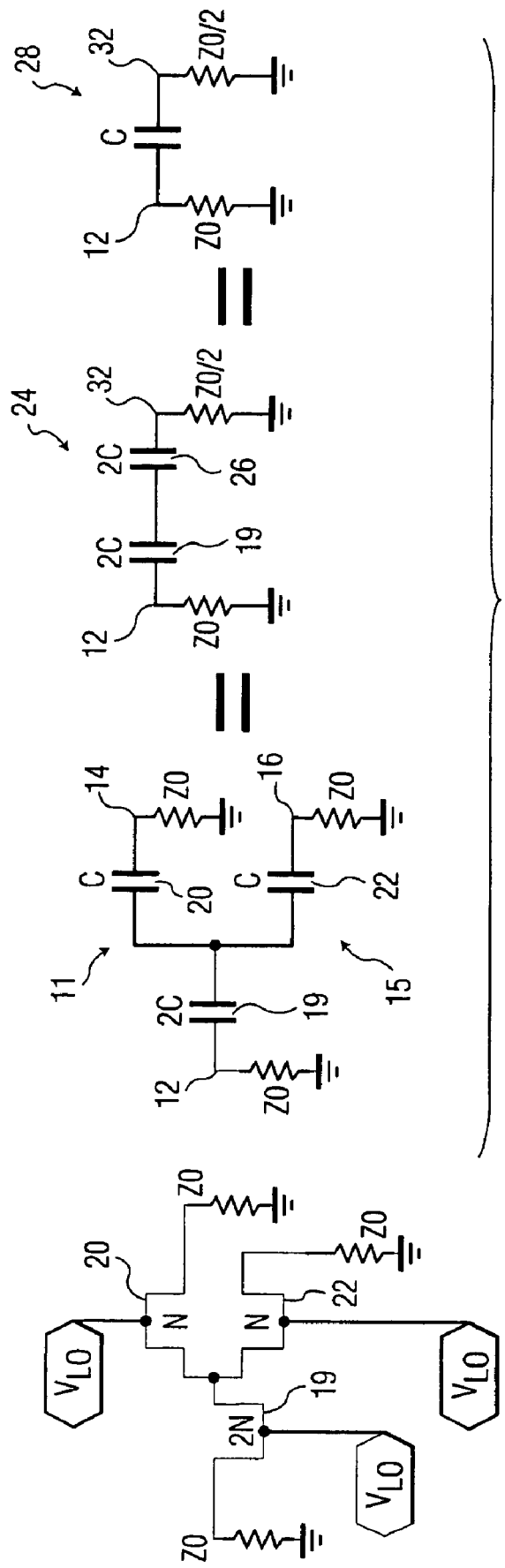
FIG. 4 is a set of schematic electrical circuit diagrams modeling the circuit shown in FIG. 2, where both branches are in an "OFF" state.

FIG. 3 shows the conventional circuit of FIG. 1 but with both branches in an OFF state. The FETs 13 and 20 in branch 11 each contribute a junction capacitance C, which reduces to C/2. Likewise, the junction capacitance C of each of FETs 17 and 22 in branch 15 combine to equivalent capacitance C/2. As is shown in the last stage of simplification, the impedance seen at input 12 of the OFF circuit is C. In FIG. 4, which is the circuit shown in FIG. 2 but with both branches OFF, the junction capacitance contributed by large common switching FET 19 is 2C. Branch FETs 20 and 22 each show junction capacitance C. This reduces, as is shown in middle diagram 24, to two capacitances in series each having a value of 2C. Simplified diagram 28 shows that this reduces to an input impedance of C as seen from port 12. In the OFF state, therefore, the conventional and cascaded methods yield the same impedance results.

Figure 5:
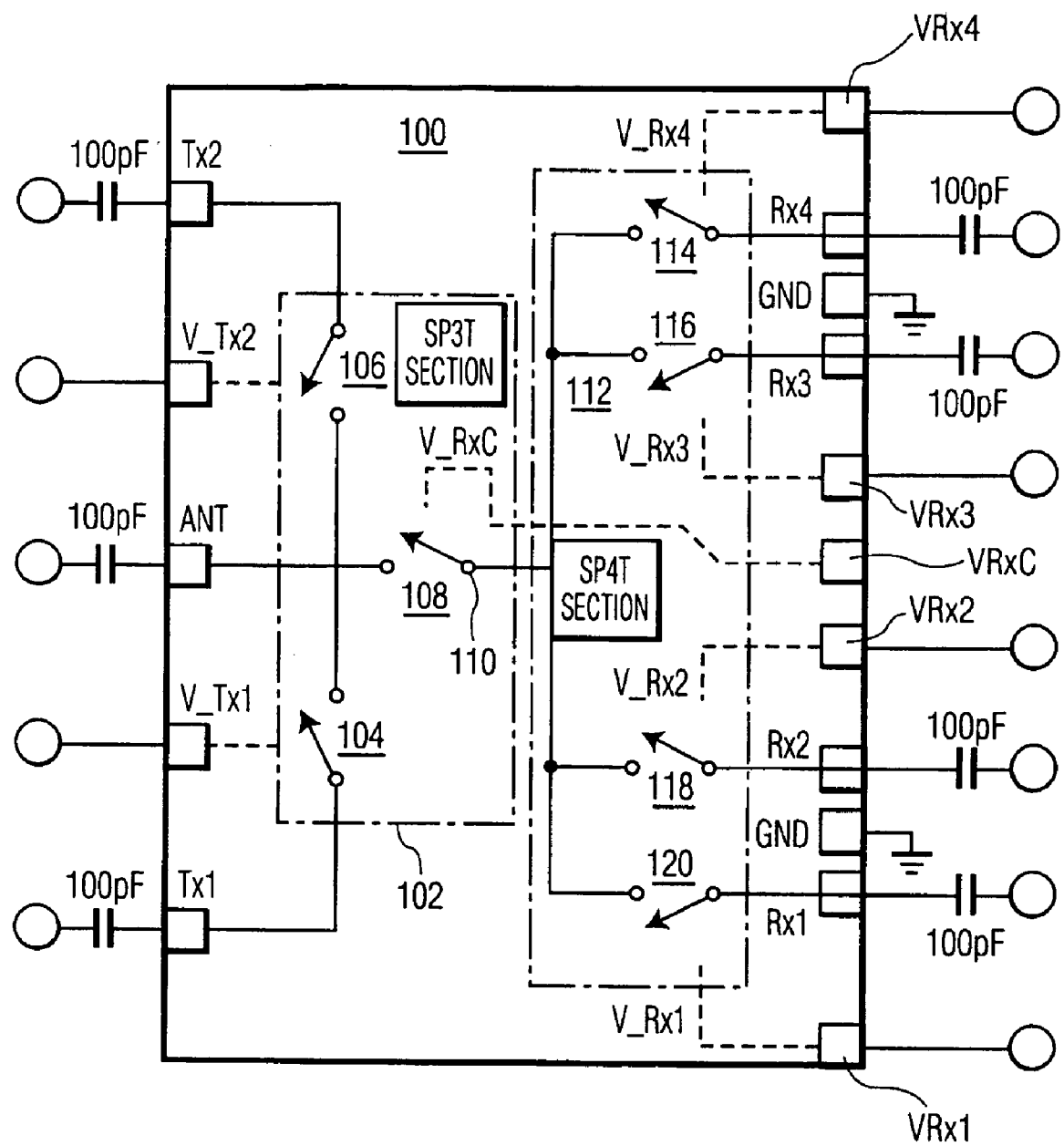
FIG. 5 is schematic electrical circuit diagram of a single-die integrated circuit for switching a plurality of transmitter and receiver ports to and from an antenna port according to one embodiment of the invention.

FIG. 5 is a schematic layout of a cascaded-branch integrated circuit according to one embodiment of the invention. This embodiment may be fabricated on a single integrated circuit chip or die 100. Chip 100 has a plurality of signal and control ports/bonding pads at its outer margins.

In the illustrated embodiment, the transmitter ports are arranged along one side of the die, while the receiver ports are arranged along an opposite side of the die. The transmitter ports include ports Tx2 and Tx1. The loads connected to these ports are modeled as 100 picofarad capacitors. Transmitter switching signal lines VTx1 and VTx2 are associated with transmitter ports Tx1 and Tx2, respectively. The left side of the die in this example also has an antenna port ANT to which one of the transmitter ports or one of the receiver ports is to be connected.

In the illustrated embodiment, the integrated circuit 100 includes a single pole, three throw (SP3T) switching section 102, the boundaries of which are shown in dotted and dashed line. The signal paths are shown in solid line while the switching control signal paths are shown in dotted line. Switching section 102 includes a switch 104, which is operable by control line VTx2 to connect transmitter port Tx1 to the antenna port ANT. A similar switch 106 is operable by switching signal VTx2 to connect transmitter port Tx2 to the antenna port ANT. A switch 108 is a first stage in a cascaded switching system and is operable by a receiver switching signal VRxC to connect a receiver signal node 110 to the antenna port ANT. While in the illustrated embodiment the integrated circuit 100 selectively switches one of two transmitter ports, the invention also contemplates embodiments having one or three or more transmitter ports.

The embodiment illustrated in FIG. 5 has four receiver ports Rx1, Rx2, Rx3 and Rx4, bonding pads for which are arranged along the right side (as seen in this Figure) of the die opposite the transmitter ports and the antenna port. A selected one of these receiver ports Rx1-Rx4 is switched by a single pole, four throw (SP4T) switching section 112. The switching section 112 is operable to switch one of four receiver ports Rx1-Rx4 to the node 110. In particular, the receiver switching section 112 includes a switch 114 operable by control voltage VRx4 to switch receiver port Rx4 to the node 110; switch 116 operable by switching voltage VRx3 to switch receiver port Rx3 to node 110; switch 118 operable by switching voltage VRx2 to switch receiver port Rx2 to node 110; and switch 120 operable by switching voltage VRx1 to switch receiver port Rx1 to node 110. One of the switches 114-120 is operated in conjunction with switch 108 to connect a selected one of the receiver ports to the antenna port ANT. As in the transmission ports, the receiver ports Rx1-Rx4 are modeled as including 100 picofarad external loads. Using a cascaded approach to switch the antenna ANT through two stages 108, 112 reduces the insertion loss suffered by a received signal. In the embodiment illustrated in FIG. 5, the circuit 100 switches one of two transmitter ports, or one of four receiver ports, to the antenna port, while isolating the rest. The number and kind of transmitter/receiver ports can be other than shown. Where a selected one of three or more transmitter ports is to be switched to the antenna port, a cascaded set of switches would be implemented for this, as is the case for the four receiver ports in this illustrated embodiment. A cascaded switching topology would likewise be used on the receiver side where one of three or more receiver ports is to be switched to the antenna port.

Figure 6A:
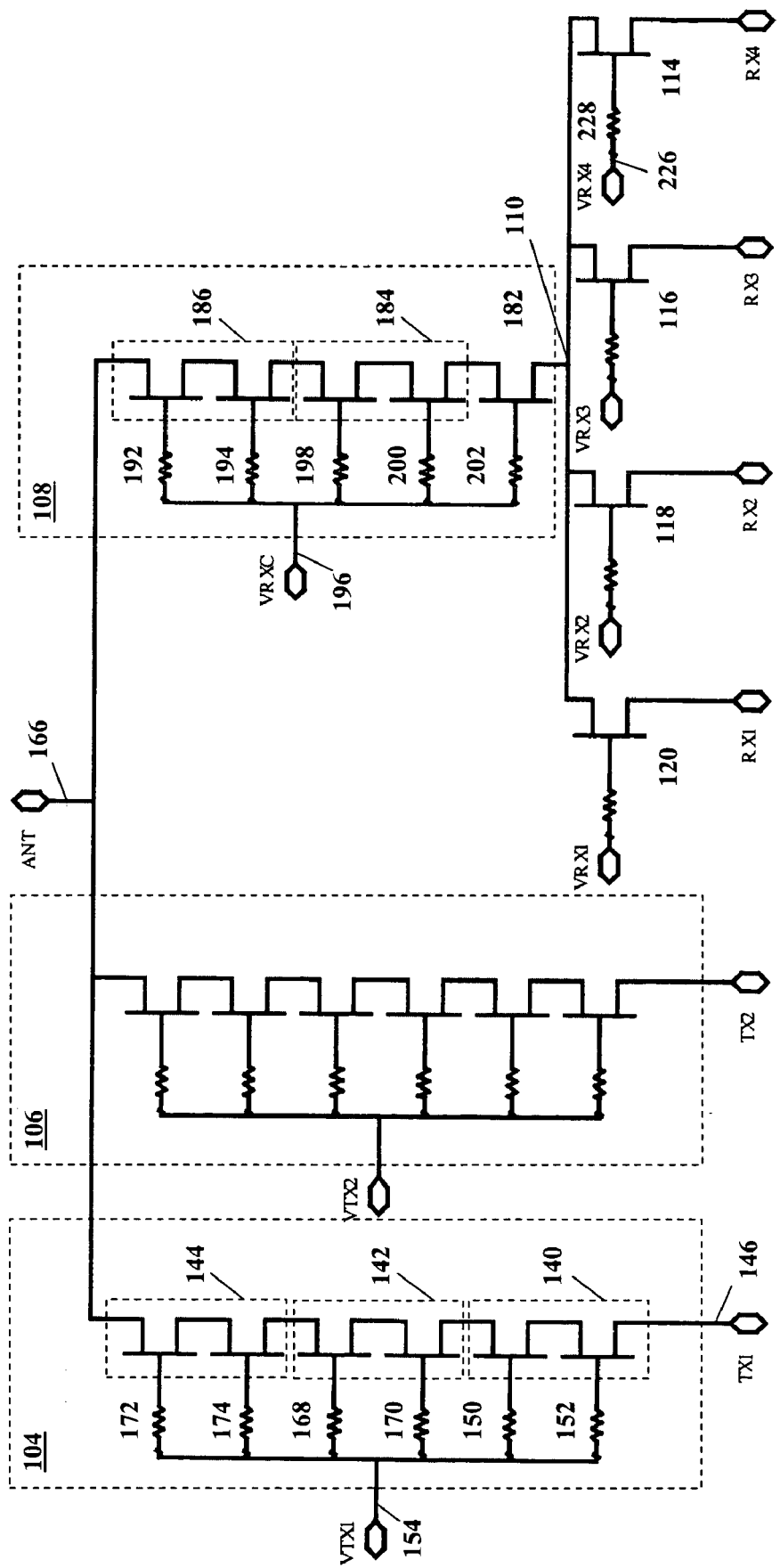
FIGS. 6(a)-(d) are electrical circuit diagrams of embodiments of the integrated circuit shown in FIG. 5.
Figure 6B:
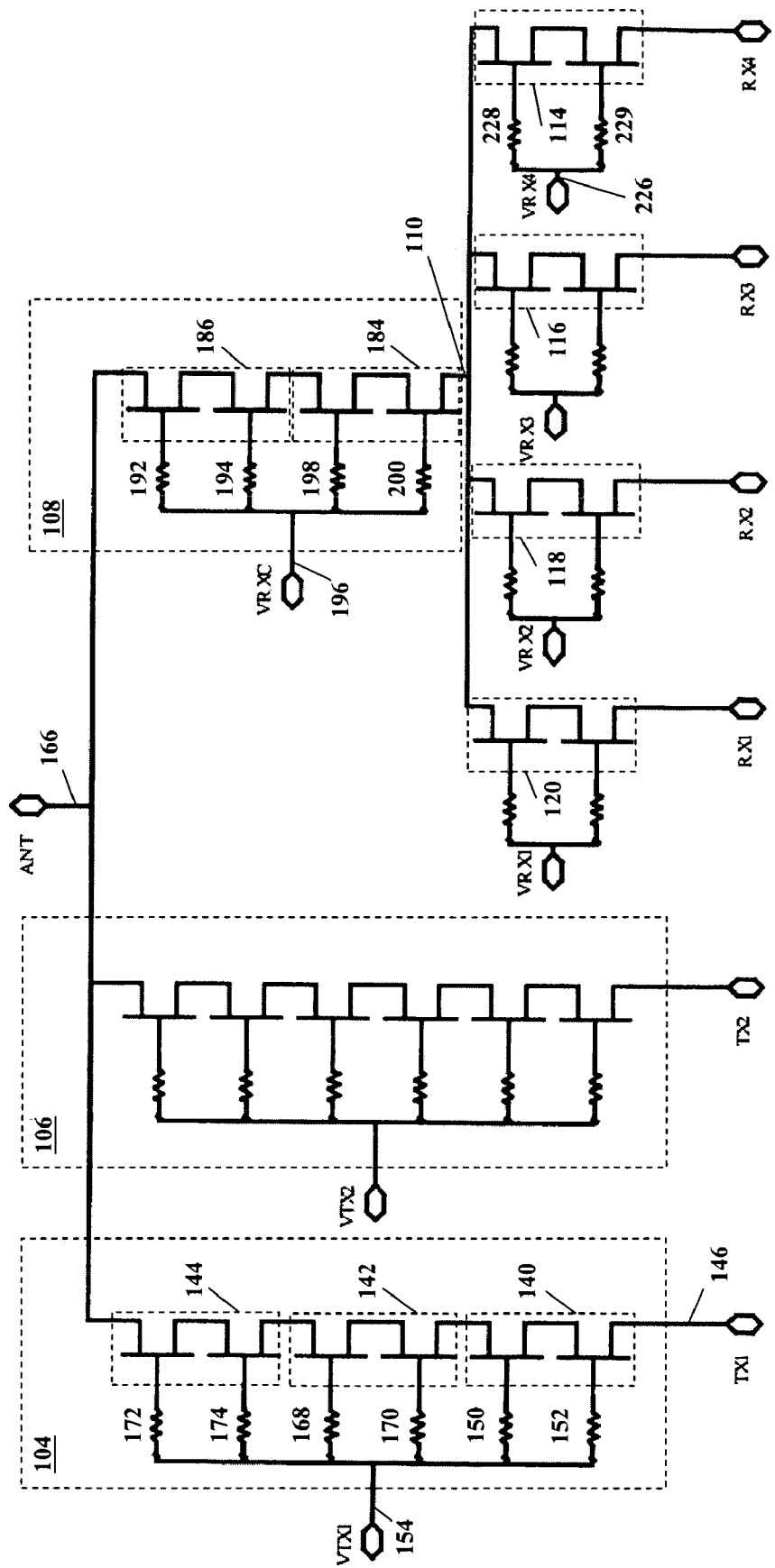
Figure 6C:
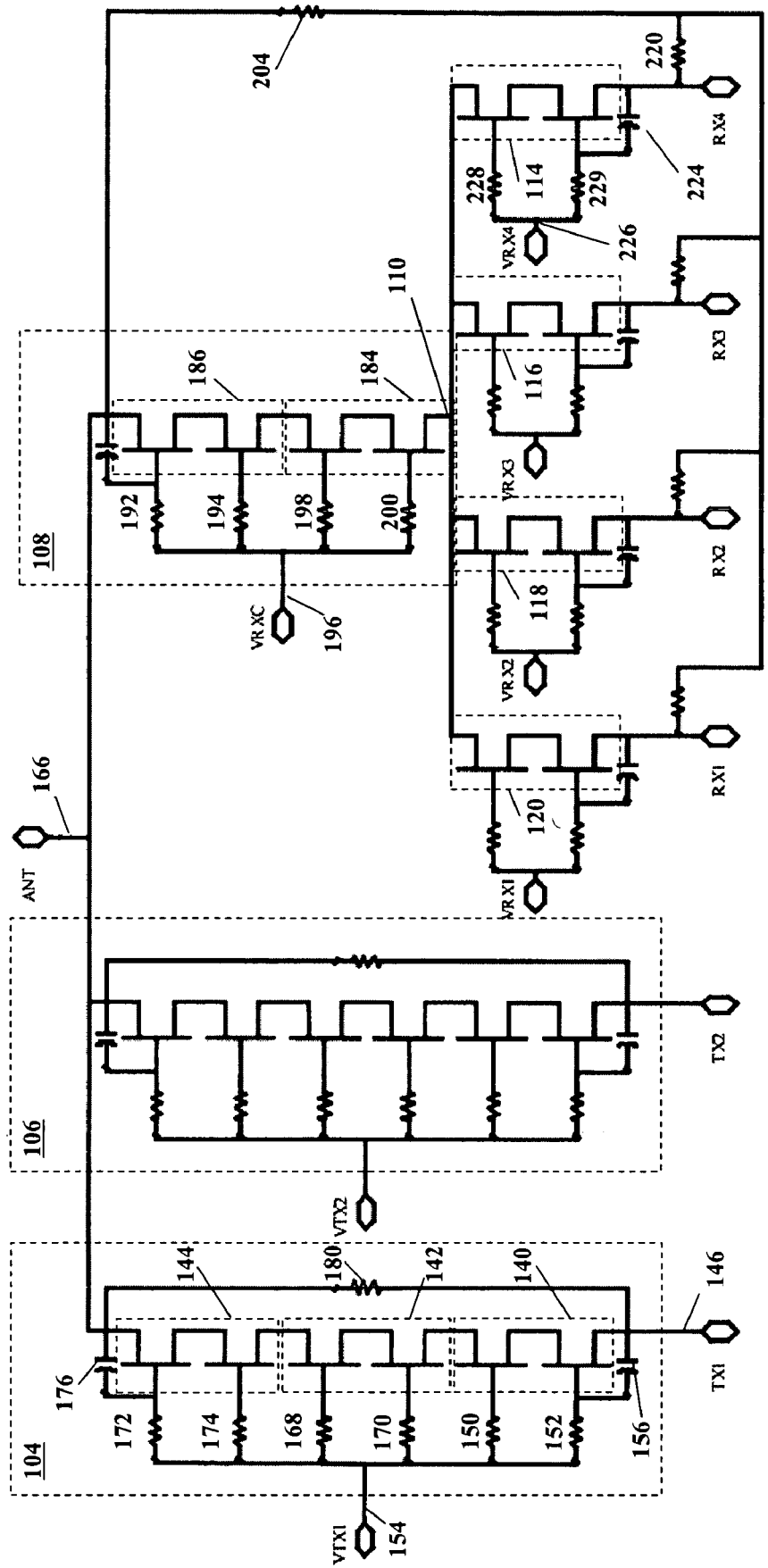

FIGS. 6(a)-(d) are electrical schematic diagrams of possible embodiments of the integrated circuit illustrated in FIG. 5. FIG. 6(a) is a general schematic illustrating the use of a single FET gate for each receiving port (Rx1-Rx4). FIG. 6(b) is a general schematic illustrating the use of two gates for each receiving port. FIG. 6(c) is a more detailed schematic illustrating the use of bypass resistors and feedforward capacitors.

Figure 6D:
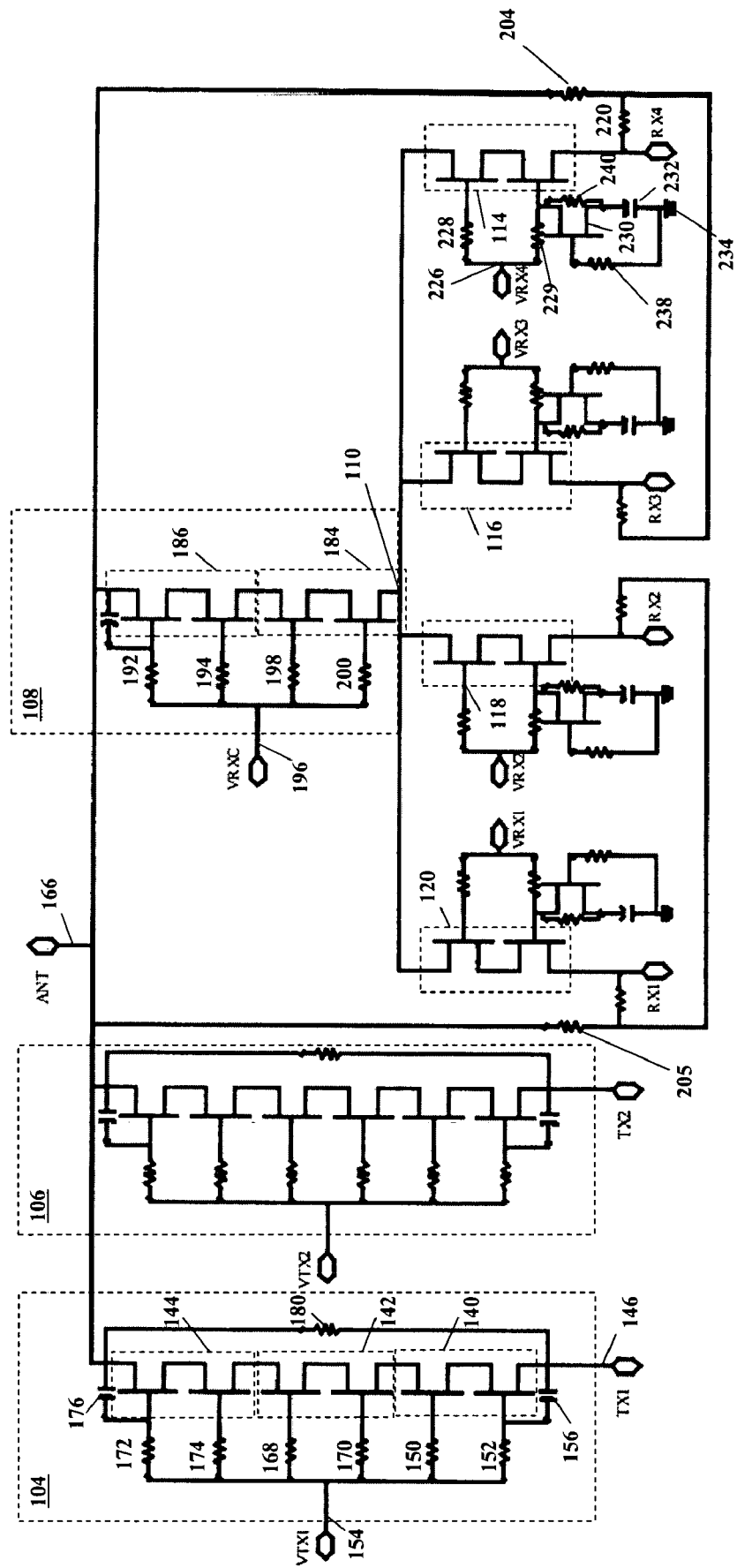

FIG. 6(d) is a more detailed schematic illustrating the use of an integrated series/shunt for the feedforward capacitors.

As discussed above, the single pole, three throw (SP3T) switching section 102 shown in FIG. 5 may include three series-connected signal path field effect transistor groups 104, 106 and 108, respectively responsible for switching transmitter ports Tx1, Tx2 and receiver node 110. In embodiments illustrated in FIGS. 6(a)-(d), switching topologies 104 and 106 are essentially similar to each other and switch 104 will be described in detail as an example. The switch 104, in the illustrated embodiment, may be composed of three series-connected field effect transistor pairs 140, 142 and 144, each of which is a pair of series-connected transistors, although the invention is not limited thereto. A transmission line or signal path 146 may connect transmitter bond pad Tx1 to a first end of a current path of a field effect transistor pair 140. The gate of each FET of pair 140 may be connected through resistances 150 and 152 to a voltage control line 154 that in turn extends to the VTx1 bond pad. A feed-forward capacitor 156 may be connected across the gate and the end of FET pair 140.

A second end (its designation as source or drain is arbitrary) of the current path of double FET 140 may be connected to one end of the current path of a middle FET pair 142. Likewise, a second end of FET pair 142 may be connected to one end of the current path of a last FET pair 144. A second end of the current path of FET pair 144 may be connected to node 166, which in turn may be connected to the antenna bond pad. The voltage control line 154 for signal VTx1 may be connected via parallel resistors 168 and 170 to the control electrode or gate of double FET 142, and by resistors 172 and 174 to the gate of the last double FET 144. A feed-forward capacitor 176 may be connected from the gate of double FET 144 to the second end 164 of the current path thereof. Completing the topology of this switching element, as illustrated in the embodiments shown in FIGS. 6(c)-(d), a bypass resistor 180 may be connected from across FET pairs 140-144, thereby creating a parallel path to the series-connected current path of FETs 140, 142 and 144.

In the illustrated embodiments, signal switching FETs 140-144 may be n-channel enhancement mode insulated gate field effect transistors. Other kinds or conductivity types of transistors could be employed in these positions, such as bipolar transistors or junction field effect transistors. The conductivity type of the transistors could also be p-channel instead of n-channel and the invention is not limited. The transistors in the illustrated embodiment may be formed at the face of a semiconductor layer such as silicon or, more preferably, gallium arsenide.

The switching element 104 may carry a relatively strong transmitter switching signal from line 146. In the illustrated embodiment, the Tx1 switching element 104 may be built around six series-connected FETs arranged in pairs, although in other embodiments the number of series-connected FETs could be increased or decreased. Multiple series-connected FETs may be used to form switching elements 104, 106 and 108 in the illustrated embodiment to permit the switch to operate at a low control voltage (i.e., a low voltage for VTx1) without the need to increase device periphery or die size.

In theory, an ideal switch provides no output until the saturation voltage on the gate is obtained. However, in practice a switching element, such as switch 104, does not have a precise turn-on time and instead starts to turn on prior to the saturation voltage being applied. The use of a bypass resistance topology shown in FIGS. 6(c) and (d), such as a single resistor 180 spanning all three series-connected double FETs 140, 142, 144, increases the timing precision of the switch activation. The bypass resistor 180 provides a known resistive path. The bypass resistance is selected to be less than the resistance of the FETs 140-144 in an OFF state, but more than the FETs 140-144 in an ON state. The selection of the resistance of resistor 180 within this value range allows the bypass resistor 180 to control the flow of current through the switching element 104.

When the switch 104 is in an OFF state, the bypass resistor 180 produces a known current flow, in effect a known leakage current, through that path. As the control voltage is increased towards the saturation voltage, the resistance of the FETs 140-144 starts to be reduced. This reduction in resistance of the FETs 140-144 would normally lead to increased leakage current or partial switch activation prior to the saturation current being reached. However, the bypass resistor 180 limits, and ideally prevents, the current from flowing through the FETs 140-144 until a point when the resistance of such FETs is less than the resistance of the bypass resistor 180. In effect, the bypass resistor 180 limits current from flowing through the FETs until the FETs are closer to reaching the saturation voltage and then turning on. Thus, the bypass resistor 180 increases the precision timing of switch activation by sharpening the control voltage.

The use of bypass resistor 180 focuses the increase of precision activation timing on the whole switching element 104 instead of the individual FETs 140, 142 or 144 making up the switch, as linearity is not an issue. In the exemplary embodiment, the devices 140-144 do not require high linearity. A single bypass resistor 180 is also preferred, where, as here, a relatively large current will be output once the switch is activated. In an alternative embodiment, the resistor 180 would be replaced with a plurality of resistors each spanning the individual field effect transistors 140-144. The substitution of individual resistors for the FETs 140-144 would focus the increase of activation timing precision on each individual FET 140-144. This may be important when process variations in the creation of FETs 140-144 cause their performance characteristics to vary. The use of individual resistors in the place of resistor 180 would permit the resistance values to vary such that the transistors 140-144 would turn on and off at about the same time despite any such process variations.

In an alternative embodiment in which precise on/off switching is not as critical as the savings in die real estate, the bypass resistor 180 could be omitted (as shown in FIGS. 6(a)-(b)).

It is preferred that each of the switching elements 104, 106 and 108 include one or more feed-forward capacitors, such as capacitors 156 and 176, as shown in FIGS. 6(c)-(d). These feed-forward capacitors are used to reduce signal distortion and improve the linearity and harmonic noise reduction characteristics of the FETs 140-144 with which they are associated. In other embodiments one or both of the feed-forward capacitors 156 or 176 could be omitted, as shown in FIGS. 6(a)-(b).

The feed-forward capacitors may be formed by methods known in the art. In particular, the metallization used in the formation of the gates of the FETs 140-144 may be extended to form one electrode of, e.g., capacitor 156 and the metallization to form signal transmission line 146 may be extended to form the other electrode thereof, with a suitable dielectric material in between them.

While in other embodiments, the FET-based switching element 106 could vary from the switching element 104 in the number of series-connected FETs, the presence or absence of a bypass resistor or of feed-forward capacitors, or the electrical values of any of these, in the illustrated embodiment the switching element 106, which switches signal path Tx2 under the influence of control voltage VTx2, is identical to switching element 104. It will therefore not be described in further detail.

Switching element 108 is in most respects similar to switching elements 104 and 106 in configuration. Switching element 108 includes, in the illustrated embodiments, two series-connected transistor pairs 184 and 186, which preferably are n-channel insulated gate field effect transistors. A first end (e.g., the drain) of the current path of double FET 186 is connected to antenna node 166. Another end of the current path or channel of double FET 184 may be connected to the receiver switching node 110.

In the illustrated embodiments, parallel resistors 192 and 194 are used to connect VRxC voltage control line 196 to the control electrode or gate of transistor pair 186. Similarly, parallel resistors 198 and 200 connect voltage control line 196 to the gate of FET pair 184. In the embodiment shown in FIG. 6(c), a bypass resistor 204 may be connected across the current paths of the series connected FETs 184-186. Alternatively, as shown in FIG. 6(d), bypass resistors 204 and 205 may be used.

As noted above, the switching section 108 is the first stage of the receiver switching circuitry, the second stage including multiple (e.g., four) receiver signal switching transistors 114, 116, 118 and 120. These transistors may comprise, for example, a single FET or an FET pair, as shown in the illustrated embodiments. First ends of the current paths of these transistors (in the illustrated embodiment, the drains) may each be connected to the intermediate node 110. Along any one receiver signal/antenna signal paths, double FETs 184, 186 may be paired with one of switching transistors 120, 118, 116 and 114, such that there are six transistors in the signal path. This then matches the transistors in the receiving signal path to the six transistors in each of the transmitter signal paths. In the embodiment shown in FIG. 6(a), an additional FET may be included in switching section 108.

A second end of the current path of FET 114 may be connected to the bond pad for receiver signal Rx4. A second end of the current path of FET 116 may be connected to the bond pad for receiver signal Rx3. A second end of the current path of FET 118 may be connected to the bond pad for receiver signal Rx2. A second end of the current path of series FET 120 may be connected to the bond pad for receiver signal Rx 1.

In the illustrated embodiment, each of the receiver switching transistors 114-120 may have associated with it a set of components including a gate resistor, a feed-forward capacitor and a shunt transistor. Because in the illustrated embodiment these elements are identical from one of the series receiver switching transistors 114-120 to any of the others, only one set of them will be described here. It will be understood that the invention contemplates variations in the presence or absence of these elements, and variations in their values, from one of the receiver switching transistors 114-120 to another, depending on process and design considerations.

Gate resistors 228, 229 may connect the gates of each FET of transistor 114 to a bond pad for receiver control signal VRx4 through gate node 226. Gate node 226 may also be connected through the current path of a shunt transistor 230 and a shunt capacitor 232 to a bond pad 234, which in turn is connected to ground. The gate of the shunt transistor 230 may be connected via a resistor 238 to pad 234. Shunt transistor 230 is preferably much smaller than the signal switching transistor 114 with which it is associated, and is a depletion-mode device. A bypass resistor 240 may be connected across the current path of the shunt transistor 230 in order to sharpen its timing.

One of the principal reasons for the use of shunt transistor 230 and related components is to increase the isolation of node 110 from receiver signal node Rx4 when the receiver signal switching 114 is in an OFF state. This occurs because the same signal VRx4 is fed to the gate of transistor 114 and to the drain of shunt transistor 230. Any value of control signal VRx4 will have opposite effects on the operation of the transistor 114 and the shunt transistor 230. For example, where the value of VRx4 is chosen to exceed the value of the expected signal voltage of Rx4 less a pinchoff voltage Vp (on the order of 0.7V), VRx4 will turn on the switching transistor 114 while simultaneously turning off the shunt transistor 230. If the value of VRx4 is toggled to a value that is intentionally less than Rx4-Vp, then VRx4 will turn off the switching transistor 114 while simultaneously turning on the shunt transistor 230. This depletes the voltage on gate node 226 and increases the isolation of node 110 from Rx4 port/bond pad. The shunt capacitor 232 prevents resistance coupling of the shunt transistor current path to ground.

While in the illustrated embodiment a single integrated circuit has been provided to switch one of four receiver ports or one of two transmitter ports to the antenna port, the number of receiver ports and/or the number of transmitter ports can be varied as desired, as the switching circuitry provided with each such port is largely modular. Further, the multiple-series-FET switching elements 104 and 106 are provided with the expectation that they will be switching signals of relatively high current to the antenna node for outbound, preferably wireless transmission. On the other hand, a signal sensed on the antenna will be weaker and therefore the switches 114-120 have a single FET each. The number and size of the switching transistors may be varied according to the contemplated strengths of the signals they are meant to switch.

Figure 7:
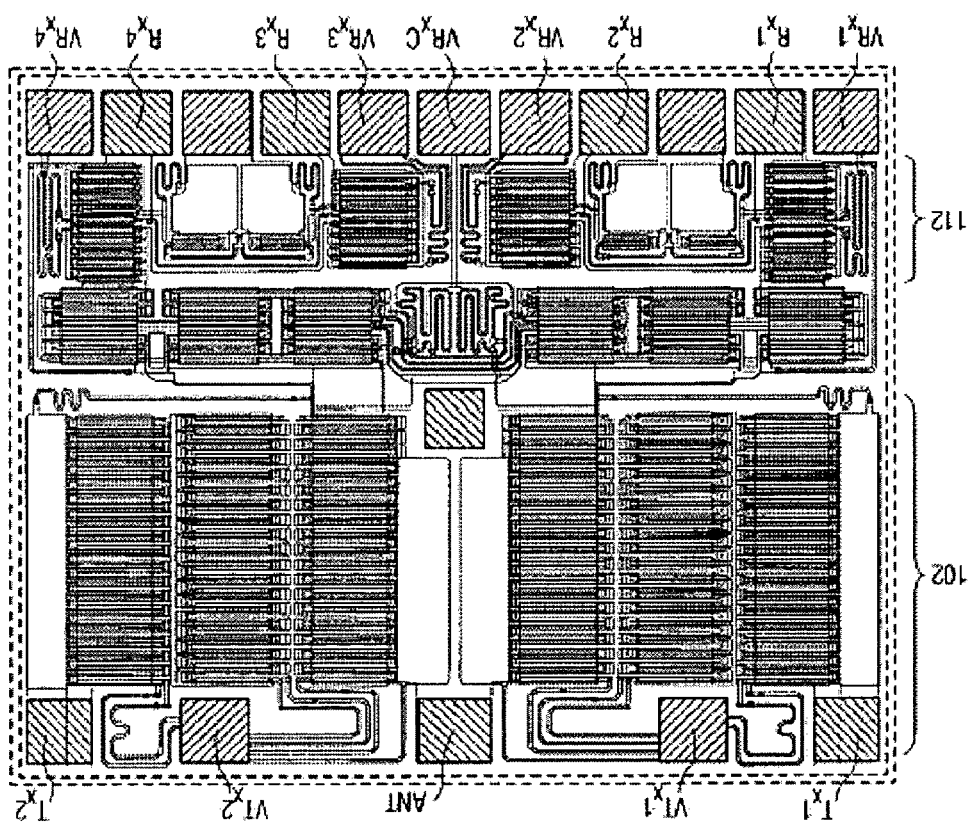
FIG. 7 is a plan view of a representative topological layout of the circuit illustrated in FIGS. 3 and 4.

FIG. 7 shows a layout and topography of an integrated switching circuit similar to that shown in FIGS. 5 and 6(a)-(d). The FETs for switching transmitter signals Tx1 and Tx2 are shown at 102, while the receiver switching section is shown at 112. Each of the series switching FETs are high-power interdigitated switching transistors in which the sources and drains each have a plurality of fingers that are interleaved with each other. The interdigitated sources and drains maybe created by suitable implants of a first conductivity type into a semiconductor substrate having an opposite conductivity type, and the implants may be self-aligned to the gates which are disposed between them. In the illustrated embodiment, the gates are sinuous metallizations, but in alternative embodiments the gates can be branched instead. The shapes of the channels of course correspond to the gates.

The second-stage receiver transistors in section 112 are smaller, in recognition that they have to switch signals of less power. The transistors are relatively small and in the illustrated embodiment have only one, noninterdigitated source and drain region apiece. The channels of the transistors are doped so as to be depletion-mode devices. The resistors can be created in a conventional manner, such as lines of polycrystalline silicon, and their values can be adjusted by adjusting their lengths.

In operation, the integrated circuit in the illustrated embodiments may operate in either of two transmission modes or any of four receiver modes. If, for example, a signal is to be transmitted from pad Tx1, VTx1 will be high, and VTx2, VRxC, VRx2, VRx1, VRx3 and VRx4 will be low. This turns on series transistor topology 104 on, and turns all other switching transistors off. In this condition the series transistor topology 104 will contribute a relatively low resistance to the insertion loss and the junction capacitance of the other, OFF branches of the circuit contribute little to the sensed impedance.

If a particular signal (say, one to appear on Rx3) is to be received, control signals VTx1, VTx2, VRx1, VRx2 and VRx4 will be low. Control signals VRx3 and VRxC will be high, turning on transistor topology 108 and transistor 116. The ON transistors 108, 116 will contribute a relatively low amount of resistance to overal signal insertion loss; the relatively high junction capacitances contributed by the OFF branches are neglected. Hence, the cascaded circuit topology exhibits less signal insertion loss than the conventional non-cascaded topology.

In summary, a single-die integrated circuit has been shown and described which can be used to switch a plurality of wireless signals to and from an antenna. The described IC arranges its switching FETs in a cascaded topology in order to reduce insertion loss in the strength of the switched signals. The integrated circuit in accordance with embodiments of the invention is useful for switching signals in CDMA, w-CDMA, IEEE 802.11, Bluetooth and like wireless protocols and saves space in comparison to chips which handle transmission or reception alone.

While preferred embodiments of the present invention have been illustrated in the appended drawings and described in the detailed description above, the present invention is not limited thereto but only by the scope and spirit of the appended claims.

What is claimed is:

1. A single-die integrated circuit for switching among a plurality of transmission ports and a plurality of received reports, comprising:
   a transmitter switching section having a plurality of transmission ports, said transmitter switching section operable to switch a selected one of the plurality of transmission ports to a transmission node wherein, for each transmission port, the transmission switching section includes a plurality of FETs having current paths coupled in series with each other and operable to couple the transmission port to the transmission node, wherein a first one of the FETs proximate the respective transmission port has a current path with a first end coupled to the transmission port and a gate;
   a first feed-forward capacitor coupled between said first end of said current path and said gate of said first one of the FETs; and
   a receiver switching section having a plurality of received ports, said receiver switching section operable to switch a selected one of the plurality of received reports to the transmission node.

2. The integrated circuit of claim 1, wherein the receiver switching section includes at least two cascaded stages, a first cascaded stage controllable to switch the transmission node to a receiver node, a second cascaded stage controllable to switch the receiver node to a selected one of the plurality of receiver ports.

3. The integrated circuit of claim 1, and further comprising an antenna port coupled to the transmission node.

4. The integrated circuit of claim 1, wherein at least one of the FET switching topologies includes at least one FET having a plurality of contiguous source regions interdigitated with a plurality of contiguous drain regions, a sinuous gate formed to wind between the source regions and the drain regions.

5. The integrated circuit of claim 1 wherein the plurality of FETs further comprises a last one of the FETs proximate the transmission node and having a current path with a first and coupled to the transmission node, the integrated circuit further comprising a second feed-forward capacitor coupled from gate to the first end of said current path of said last one of the FETs.

6. no The integrated circuit of claim 5, further comprising, in each transmitter switching section, a bypass resistor coupled in parallel with the current paths of the plurality of FETs in series.

7. The integrated circuit of claim 1, further comprising, in each transmitter switching section, a bypass resistor coupled in parallel with the current paths of the plurality of FETs in series.

8. A single-die multiband switch for wireless communication, comprising:
   an antenna port;
   a plurality of transmitter ports, for each transmitter port a switching topology operable to switch the transmitter port to the antenna port; and
   a plurality of received ports,
   a switching topology operable to switch a selected one of said receiver ports to the antenna port, said switching topologies comprising a multiple-stage switching circuit, a first stage of the multiple-stage switching circuit selectively connecting or isolating the antenna port from the multiple-stage switching topology, and a last stage of the multiple-stage switching topology selectively connecting or isolating a plurality of the receiver ports from the multi-stage switching topology, wherein said last stage includes, for each receiver port, a signal path FET having a current path controllable to connect the receiver port to an intermediate node, said first stage operable to connect the intermediate node to the antenna port, and wherein each said signal path FET has a gate to which a control signal is applied, a shunt FET having a drain coupled to the gate of the signal path FET, a source coupled to ground, and operable to enhance isolation of the receiver port from the intermediate node when the signal path FET is in and OFF state.

9. The switch of claim 8, wherein said first stage of said switching topology comprises a plurality of series-connected field effect transistors, wherein a control signal for said switching topology controls said switching topology to selectively connect or isolate a respective transmitter or receiver port from the antenna port.

10. The switch of claim 8, wherein at least one of the switching topologies comprises at least one interdigitated field effect transistor having a plurality of elongated contiguous drain regions, a plurality of elongated contiguous source regions interdigitated with the drain regions, an elongated sinuous channel region spacing apart the drain regions from the source regions, and a gate overlying the channel region to switch the interdigitated field effect transistor between an ON and an OFF state.

11. The switch of claim 8, wherein the die has an area, the transmitter port switching topologies occupying an area on the die which is substantially larger than the receiver port switching topologies.

12. A method of switching one of a plurality of transmitters and a plurality of receivers to a transmitter/receiver antenna, comprising the steps of:
   connecting each transmitter to a respective one of the plurality of transmitter ports formed on a single integrated circuit die;
   connecting each receiver to a respective one of a plurality of received reports formed on the die;
   controlling a selected one of a plurality of switching topologies, each associated with a respective one of the transmitter and receiver ports, to connect a respective selected one of the transmitter and receiver ports to an antenna port formed on the die; and controlling other ones of the switching topologies to isolate others of the transmitter and receiver ports from the antenna port;

for a selected one of the receiver or transmitter ports, switching a transistor having a signal path between an associated one of the receiver or transmitter ports and the antenna to an ON state to pass a signal from said associated receiver or transmitter port through said current path of the signal path transistor;

turning off an associated shunt transistor having a drain connected to a gate of the at least one signal path transistor so as to isolate the gate from ground;

for at least one other receiver or transmitter port, switching a transistor having a signal path between an associated one of the receiver or transmitter ports and the antenna to an OFF state; and turning on an associated shunt transistor having a drain connected to a gate of the at least one other signal path transistor such that the gate is coupled to ground so as to enhance the isolation of the at least one other receiver or transmitter port from the associated receiver or transmitter port.

13. The method of claim 12, and further including the steps of:

arranging at least some of the switching topologies in cascaded stages including a first stage coupled to the antenna port and a last stage coupled to a plurality of the transmitter or receiver ports;

connecting a selected one of the last said transmitter or receiver ports to the antenna ports by switching on the first stage, and switching on a switch associated with said selected one of the last said transmitter or receiver ports wherein the last said switch is a portion of the last stage; and switching off the remaining switching topologies and other switches in the last stage.

14. The method of claim 13, wherein said step of controlling a selected one of the switching topologies includes the step of switching a plurality of series-connected switching transistors to an ON state.

15. A single-die integrated circuit for switching among a plurality of transmission ports and a plurality of received reports, comprising:

a transmitter switching section having a plurality of transmission ports, said transmitter switching section operable to switch a selected one of the plurality of transmission ports to a transmission node wherein, for each transmission port, the transmission switching section includes a plurality of FETs having current paths coupled in series with each other and operable to couple the transmission port to the transmission node, wherein a last one of the FETs proximate the transmission node has a current path with a first end coupled to the transmission node and a gate;

a first feed-forward capacitor coupled between said first end of said current path and said gate of said last one of the FETs; and a receiver switching section having a plurality of received ports, said receiver switching section operable to switch a selected one of the plurality of received reports to the transmission node.

16. The integrated circuit of claim 15, further comprising, in each transmitter switching section, a bypass resistor coupled in parallel with the current paths of the plurality of FETs in series.

17. A single-die integrated circuit for switching among a plurality of transmission ports and a plurality of received reports, comprising:

a transmitter switching section having a plurality of transmission ports, said transmitter switching section operable to switch a selected one of the plurality of transmission ports to a transmission node wherein, for each transmission port, the transmission switching section includes a plurality of FETs having current paths coupled in series with each other and operable to couple the transmission port to the transmission node;

a bypass resistor coupled in parallel with the current paths of the plurality of FETs in series; and a receiver switching section having a plurality of received ports, said receiver switching section operable to switch a selected one of the plurality of received reports to the transmission node.

* * * * *